United States Patent
Zhang et al.

(10) Patent No.: US 12,237,427 B2
(45) Date of Patent: Feb. 25, 2025

(54) TUNING METHOD FOR ACTIVE METAMATERIALS USING IGZO SCHOTTKY DIODES

(71) Applicant: SHAN DONG UNIVERSITY, Jinan (CN)

(72) Inventors: Yifei Zhang, Jinan (CN); Aimin Song, Jinan (CN); Haotian Ling, Jinan (CN); Qingpu Wang, Jinan (CN)

(73) Assignee: SHAN DONG UNIVERSITY, Jinan (CN)

( * ) Notice: Subject to any disclaimer, the term of this patent is extended or adjusted under 35 U.S.C. 154(b) by 394 days.

(21) Appl. No.: 17/753,192

(22) PCT Filed: Jun. 28, 2020

(86) PCT No.: PCT/CN2020/098495
§ 371 (c)(1),
(2) Date: Feb. 23, 2022

(87) PCT Pub. No.: WO2021/051923
PCT Pub. Date: Mar. 25, 2021

(65) Prior Publication Data
US 2022/0278241 A1 Sep. 1, 2022

(30) Foreign Application Priority Data
Sep. 20, 2019 (CN) .......................... 201910893666.7

(51) Int. Cl.
*H01L 29/872* (2006.01)
*G02F 1/015* (2006.01)
(Continued)

(52) U.S. Cl.
CPC .......... *H01L 29/872* (2013.01); *G02F 1/0156* (2021.01); *H01L 29/247* (2013.01);
(Continued)

(58) Field of Classification Search
None
See application file for complete search history.

(56) References Cited

U.S. PATENT DOCUMENTS

2009/0262766 A1* 10/2009 Chen .................. H01Q 15/0086
372/26
2011/0024650 A1* 2/2011 Kolodzey ............. H01L 29/167
250/493.1

FOREIGN PATENT DOCUMENTS

GB 2595587 A * 12/2021 ......... H01L 27/0629

OTHER PUBLICATIONS

Chasin et al. "UHF IGZO Schottky Diode" (2012 International Electron Devices Meeting, San Francisco, CA, USA, 2012, pp. 12.4.1-12.4.4, doi: 10.1109/IEDM.2012.6479030) (Year: 2012).*

* cited by examiner

*Primary Examiner* — Xiaoming Liu
(74) *Attorney, Agent, or Firm* — CBM PATENT CONSULTING, LLC

(57) ABSTRACT

A tuning method for active metamaterials using IGZO Schottky diodes, wherein the IGZO Schottky diode comprises a substrate, a Schottky electrode, amorphous IGZO active layer, and an ohmic electrode from the bottom up. The method comprises steps as follows: (1) Metamaterials are used as the Schottky electrodes, and amorphous IGZO active layers are used to fully cover the capacitive gap structures in the metamaterials; such capacitive structures in the metamaterials are bonded to the amorphous IGZO active layers to form Shottky barriers; (2) The resulting IGZO Schottky diodes from step (1) are used to tune the metamaterials dynamically.

9 Claims, 6 Drawing Sheets

(51) Int. Cl.
*H01L 29/24* (2006.01)
*H01L 29/47* (2006.01)
*H01Q 15/00* (2006.01)
(52) U.S. Cl.
CPC ......... *H01L 29/47* (2013.01); *H01Q 15/0086* (2013.01); *G02F 2202/30* (2013.01)

TUNING METHOD FOR ACTIVE METAMATERIALS USING IGZO SCHOTTKY DIODES

FIELD OF THE INVENTION

The present invention relates to a tuning method for active metamaterials using IGZO Schottky diodes. It pertains to the fields of semiconductor device technologies, electromagnetics and microwave technologies.

BACKGROUND OF THE INVENTION

Metamaterials are artificially crafted composite structures or materials with extraordinary physical properties that natural materials do not have. They are generally composed of artificially-designed periodic, periodically distributed, and sub-wavelength metallic or dielectric microstructures. They can achieve specific electromagnetic responses through coupling these microstructures with incident electromagnetic waves. In recent years, metamaterials have filled the gaps of traditional materials relying on their electromagnetic properties that can be manually designed. When metamaterials are combined with semiconductors, liquid crystals, superconductors, and other tunable material systems, the active tuning of their electromagnetic properties can be achieved through external excitations, such as laser, external electric field, external magnetic field, stress, or chemical agent.

Among the active tuning methods for metamaterials, the most common one is to adjust the carrier density in the channels of field-effect transistor structures. For example, Xu, W. Z. et al. provides a method of tuning the oxide semiconductor IGZO in *Sci. Rep.* 6, 23486 (2016) "Electrically tunable terahertz metamaterials with embedded large-area transparent thin-film transistor arrays"; the literatures (Ju, L. et al. Grapheneplasmonics for tunable terahertz metamaterials. *Nat Nanotechnol.* 6, 630-634 (2011), Jadidi, M. M. et al. Tunable Terahertz Hybrid Metal-GraphenePlasmons. *Nano Lett.* 15, 7099-7104 (2015), and Balci, O. et al. Graphene-enabled electrically switchable radar-absorbing surfaces. *Nat. Commun.* 6, 6628 (2015)) provide several methods of tuning graphene. For now, most active tuning methods for metamaterials are based on graphene transistors, and their depth of modulation is limited by the quality of the grapheme used (See Geim, A. K. & Novoselov, K. S. The rise of graphene, *Nat. Mater.* 6, 183-191 (2007)). The tuning method of active metamaterials based on IGZO field-effect transistors has a very low modulation depth, and the transistor gate electrodes adversely affect the electromagnetic properties of the metamaterials.

In addition, Schottky diodes can also achieve the dynamic control of metamaterials by tuning the carrier concentrations in the semiconductor channels. In 2006, active tuning methods for terahertz metamaterials based on gallium arsenide (GaAs) Schottky diodes were reported in the literatures, Chen, H.-T. et al. Active terahertz metamaterial devices. *Nature* 444, 597-600 (2006) and Chen, H.-T. et al. A metamaterial solid-state terahertz phase modulator. *Nature Photonics* 3, 148-151 (2009). However, no other kind of Schottky diodes can be used for dynamically tuning metamaterials at present. The GaAs substrate used in the above mentioned two papers is rigid and expensive, which is not suitable for large-area circuits and flexible circuits and not suitable for the cost-effective applications of tunable metamaterials.

SUMMARY OF THE INVENTION

To address the drawbacks in the prior arts, the present invention provides a tuning method for active metamaterials using IGZO Schottky diodes.

The present invention achieves the dynamic tuning of metamaterials with IGZO Schottky diodes for the first time. Aiming at the problems of the existing active tuning methods for metamaterials, such as low modulation depth, high cost, complex fabrication process, and being unsuitable for flexible circuits, the present invention uses IGZO as active layers, fabricates metallic metamaterials as Schottky electrodes for applying bias, fabricates ohmic electrodes for applying bias, and constitutes Schottky diodes. By applying bias on the ohmic and Schottky electrodes, the electromagnetic properties of the metamaterials are actively tuned. The IGZO used features high electron mobility (10-50 $cm^2/Vs$), low electromagnetic loss, low cost, simple growth and production process, and good uniformity. Compared to the semiconductors with little energy band or no energy band, such as gallium arsenide and graphene, IGZO has a wider energy band and good stability so that actively tuning IGZO Schottky diodes works in the visible range band and a wide temperature range. The IGZO Schottky diodes can be prepared through magnetron co-sputtering under room temperature, which enables advantages such as large area, high yield, low cost, and flexible circuit applications.

DEFINITION OF TERMS

1. DECON: It refers to the Decon cleaning agent;
2. IGZO: It is an oxide semiconductor, and its full name is Indium Gallium Zinc Oxide; it serves as the active layer for the Schottky diode;
3. Capacitive metamaterial: It refers to a kind of metamaterial with an equivalent capacitance in the circuit model, including split-ring resonator metamaterial, capacitor-inductor resonant metamaterial, as well as the various variants and composite metamaterials thereof;
4. Surface plasmonpolariton transmission line: It refers to a new ultra-thin transmission line; it is based on a dielectric substrate, with sub-wavelength corrugated structures and deep subwavelength field confinement, and capable of conformal transmission; its sub-wavelength structures can generate equivalent negative permittivity to realize spoof surface plasmonpolariton characteristics in the microwave and terahertz range.
5. Split-ring resonator metamaterial: Its English name is split ring resonator, and it refers to a metal ring structure with a split, wherein the metal wire can be deemed as an inductor and the split generates a capacitor; when placed in a varying electromagnetic field, electric charges accumulate at the two ends of the split, producing resonance;
6. Capacitor-inductor resonant metamaterial: Its English name is electric-LC metamaterial, and it has an equivalent circuit model of LC circuit, wherein the metal wire and split gap can be deemed as an inductor a capacitor, respectively, to generate resonance;
7. Quasi-ring structure: It refers to a metal ring structure that forms a short circuit at the gap of the split resonant ring.
8. Band stop response: It refers to a kind of response wherein the signal intensity is greatly attenuated in a specific spectral range, and there is little signal attenuation outside the spectral range.

A Technical Solution of the Present Invention is Provided Below

A tuning method for active metamaterials using IGZO Schottky diodes, wherein the referred IGZO Schottky diode comprises a substrate, a Schottky electrode, anamorphous indium gallium zinc oxide (IGZO) active layer, and an ohmic electrode from the bottom up, comprising steps as follows:

(1) Metamaterials are used as the Schottky electrodes, and the said amorphous IGZO active layers are used to fully cover the capacitive gap structures in the metamaterials; such capacitive structures in the metamaterials are bonded to the amorphous IGZO layers to form Schottky barriers;

The two metal plates of each capacitive structure in the metamaterials share the same potential so that Schottky barriers are formed on the surfaces of both metal plates, which corresponds to a normal working mode.

Since the capacitive structures in the metamaterials are covered with IGZO layers, the working mechanism of the capacitive structures in the active metamaterials may be deemed as an RLC circuit, with L representing a ring inductor, C representing the capacitor within the gap, and Rg representing the variable attenuation due to free carrier absorption in IGZO layer at the gap. To function the active modulation, IGZO materials should cover the gap in the capacitive structures and well contact the two metal plates of the capacitive structures. With a forward bias voltage, the carriers in the IGZO move towards the positive voltage direction, namely from ohmic electrodes to Schottky electrodes; the free carrier concentrations in the IGZO layers at the gaps of the capacitive structures in the metamaterials increase, and so does the conductivity at the Schottky electrodes. In this way, the gaps of the capacitive structures in the metamaterials will be short-circuited, realizing reconfiguration and dynamic tuning.

(2) The resulting IGZO Schottky diodes from step (1) are used to tune the metamaterials dynamically.

Preferably according to the present invention, the gaps of the capacitive structures in the metamaterials are less than 5 μm.

To ensure that the IGZO at the gaps of the capacitive structures in the metamaterials is in a depleted state under zero bias voltage, the capacitive structures in the metamaterials, namely the gaps covered by IGZO, should not exceed 5 μm in size.

Preferably according to the present invention, the metamaterials, i.e., the Schottky electrodes, are made of Ti/Au/Pd.

Ti as an adhesion layer is used to improve the bonding strength between the metal and the substrate. Metal Au as the main signal transmission layer has excellent electrical conductivity; as the thickness of Au increases, the losses of the transmitted signal are reduced in the full frequency band. Pd as a high-work-function metal generates an oxygen-enriched environment (OEE) after oxygen plasma treatment and then is bonded to the amorphous IGZO active layer to form the Schottky barrier. However, the metamaterial used as Schottky electrodes is not limited to the high-work-function metal Pd; other metals that can form Schottky barriers with IGZO may also be used.

Preferably according to the present invention, the said metamaterials include split-ring resonator metamaterials, capacitor-inductor resonant metamaterials split-ring metamaterial arrays, or capacitor-inductor resonant metamaterial arrays.

Preferably according to the present invention, in step (2), the process of using the resulting IGZO Schottky diodes from step (1) to dynamically tune metamaterials comprises steps as follows:

A. Positive voltage is applied to the Schottky electrodes, while negative voltage is applied to the ohmic electrodes;

B. Under the zero-bias state, the IGZO layers covering the gaps of the capacitive structures in the metamaterials is depleted, while strong LC resonance is generated by the capacitive structures in the metamaterials to produce a perfect band-stop response; At 49 GHz, a strong band stop response of up to −31 dB to electromagnetic waves is presented.

C. The positive voltage is increased continuously from zero; with the increase of the positive voltage, the carriers in the IGZO active layers move towards the anode, namely from ohmic electrodes to Schottky electrodes; the free carrier concentrations in the IGZO active layers at the gaps of the capacitive structures in the metamaterials increase gradually, and so does the conductivity; then, the capacitance at the gaps is suppressed until the capacitive gap is shorted, and the metamaterial structures gradually become quasi-ring structures with weakened attenuation response to electromagnetic signals and higher transmission.

Preferably according to the present invention, a preparation method of the IGZO Schottky diodes for dynamic tuning of metamaterials from step (1), comprising steps as follows:

The substrates are cleaned;

The resulting substrates from step i) are coated with metamaterials through photolithography, electron beam evaporation, and lift-off technologies to obtain Schottky electrodes;

Amorphous IGZO active layers are grown on the resulting Schottky electrodes from step ii);

Ohmic electrodes (material: Ti/Au; thickness: 10/300 nm) are prepared on the resulting amorphous IGZO active layers from step iii) through photolithography, electron beam evaporation, and lift-off technologies More preferably, the step i) comprises steps as follows: The substrates are cleaned with DECON for 5 min, with deionized water for 10 min, and with acetone for 5 min successively; next, they are placed into ethanol immediately to clean for 5 min; finally, they are cleaned with deionized water again and dried by nitrogen gas.

More preferably, the step iii) comprises steps as follows: The patterns of the amorphous IGZO active layers are transferred to the resulting samples from step ii) through photolithography; then, the samples are cleaned with oxygen plasma for 30 min to remove adhesive residue and form oxygen-enriched environment on the surfaces; finally, 750 nm-thick amorphous IGZO layers covering the capacitive gap are fabricated with photolithography, electron beam evaporation, and lift-off technologies.

THE BENEFICIAL EFFECTS OF THE INVENTION ARE AS FOLLOWS

By combining the IGZO Schottky diode and metamaterials, the present invention achieves dynamic modulation for the electromagnetic properties of the metamaterials, including transmission, reflection, and absorption, without shifting the resonant frequency of the metamaterials. It can be used in various metamaterial devices and plasmonic devices with metamaterial structures to achieve dynamic tuning of the electromagnetic waves propagating in free space and along surfaces.

BRIEF DESCRIPTION OF THE DRAWINGS

FIG. 1 (b) is the schematic diagram for the structure II of the IGZO Schottky diode with a kind of single split-ring resonator metamaterial as Schottky electrode;

FIG. 2 (b) is the schematic diagram for the structure II of the IGZO Schottky diode with a kind of capacitor-inductor resonant metamaterial as Schottky electrode;

EMBODIMENTS

The present invention is further described as follows with reference to the embodiments and drawings. However, the present invention is not limited thereto.

Embodiment 1

A tuning method for dynamic metamaterials using IGZO Schottky diodes, wherein the said IGZO Schottky diode comprises a substrate, a Schottky electrode, amorphous IGZO active layer, and an ohmic electrode from the bottom up, comprising steps as follows:
(1) Metamaterials are used as the Schottky electrodes, and the said amorphous IGZO active layers are used to fully cover the capacitive gap structures in the metamaterials; such capacitive structures in the metamaterials are bonded to the amorphous IGZO layers to form Schottky barriers;

The two metal plates of each capacitive structure in the metamaterials share the same potential so that Schottky barriers are formed on the surfaces of both metal plates, which corresponds to a normal working mode.

Figure 7:
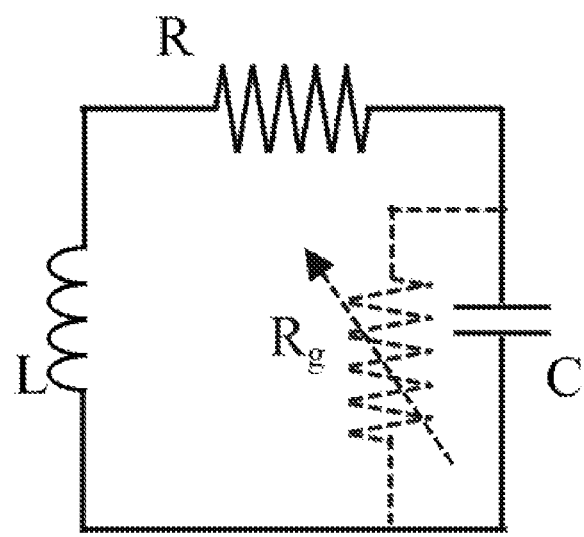
FIG. 7 is the operating principle diagram of the capacitive structure in the metamaterials.

Since the capacitive structures in the metamaterials are covered with IGZO layers, the working mechanism of the capacitive structures in the active metamaterials may be deemed as an RLC circuit in FIG. 7, with L representing a ring inductor, C representing the capacitor within the gap, and Rg representing the variable attenuation due to free carrier absorption in IGZO layer at the gap. To function the active modulation, IGZO materials should cover the gap in the capacitive structures and well contact the two metal plates of the capacitive structures. With a forward bias voltage, the carriers in the IGZO move towards the positive voltage direction, namely from ohmic electrodes to Schottky electrodes; the free carrier concentrations in the IGZO layers at the gaps of the capacitive structures in the metamaterials increase, and so does the conductivity at the Schottky electrodes. In this way, the gaps of the capacitive structures in the metamaterials will be short-circuited, realizing reconfiguration and dynamic tuning.

(2) The resulting IGZO Schottky diodes from step (1) are used to tune the metamaterials dynamically.

Embodiment 2

The tuning method for active metamaterials using IGZO Schottky diodes according to Embodiment 1, provided however that:
The gaps of the capacitive structures in the metamaterials are less than 5 μm.
To ensure that the IGZO at the gaps of the capacitive structures in the metamaterials is in a depleted state under zero bias voltage, the capacitive structures in the metamaterials, namely the gaps covered by IGZO, should not exceed 5 μm in size.

Embodiment 3

The tuning method for active metamaterials using IGZO Schottky diodes according to Embodiment 1, provided however that:
wherein the materials of the metamaterials include Ti/Au/Pd. Other metal materials forming Schottky contact with IGZO may be implemented. Ti as an adhesion layer is used to improve the bonding strength between the metal and the substrate. Metal Au as the main signal transmission layer has excellent electrical conductivity; as the thickness of Au increases, the losses of the transmitted signal are reduced in the full frequency band. Pd as a high-work-function metal generates an oxygen-enriched environment (OEE) after oxygen plasma treatment and then is bonded to the amorphous IGZO active layer to form the Schottky barrier. However, the metamaterial used as Schottky electrodes is not limited to the high-work-function metal Pd; other metals that can form Schottky barriers with IGZO may also be used.

Figure 1A:
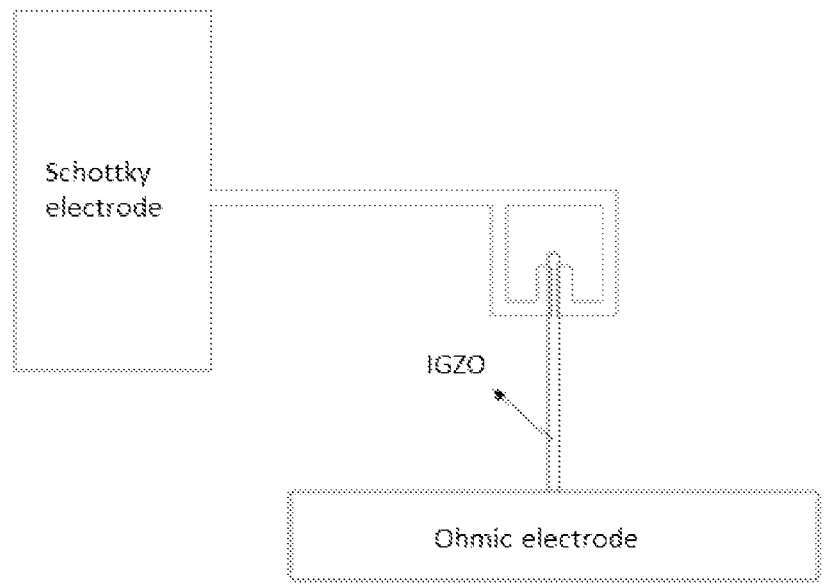
FIG. 1 (a) is the schematic diagram for the structure I of the IGZO Schottky diode with a kind of single split-ring resonator metamaterial as Schottky electrode.
Figure 1B:
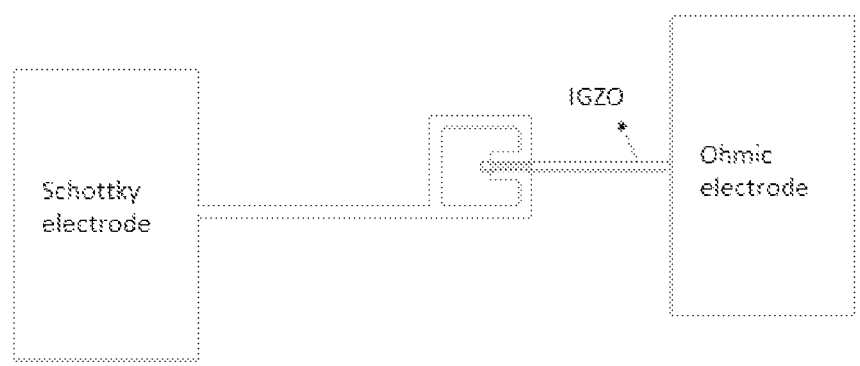
Figure 2A:
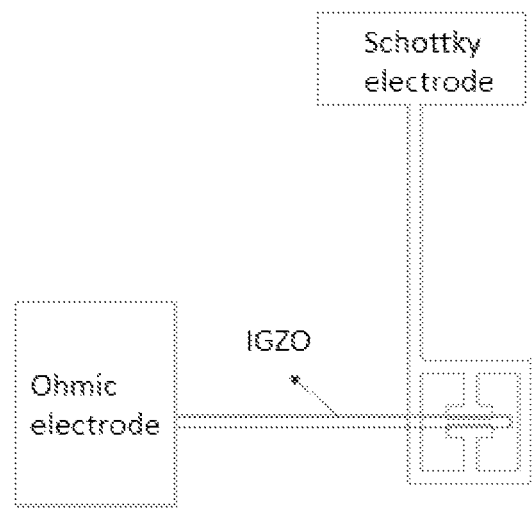
FIG. 2 (a) is the schematic diagram for the structure I of the IGZO Schottky diode with a kind of capacitor-inductor resonant metamaterial as Schottky electrode.
Figure 2B:
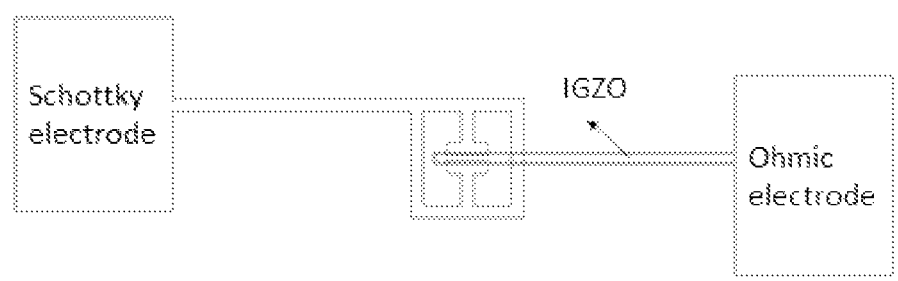
Figure 3:
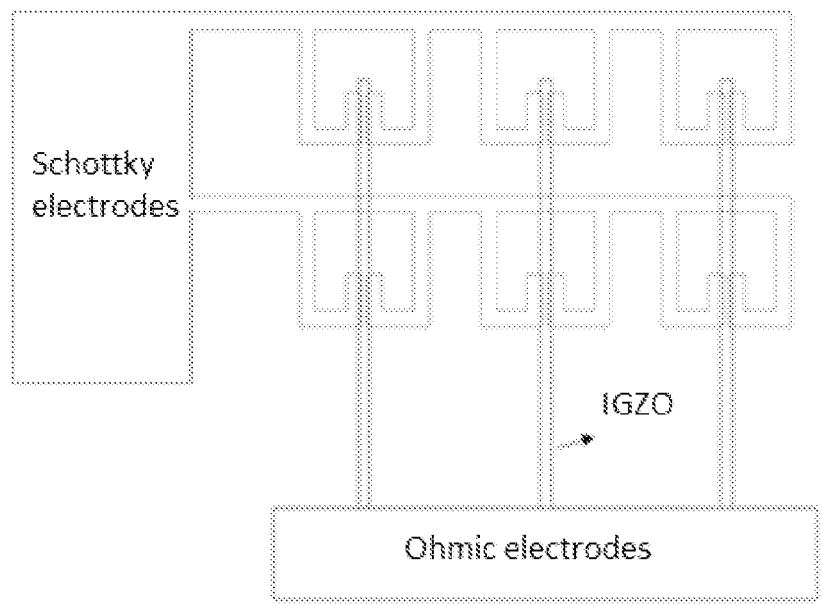
FIG. 3 is the structural schematic diagram of the IGZO Schottky diode with a split-ring resonator metamaterial array as Schottky electrode.
Figure 4:
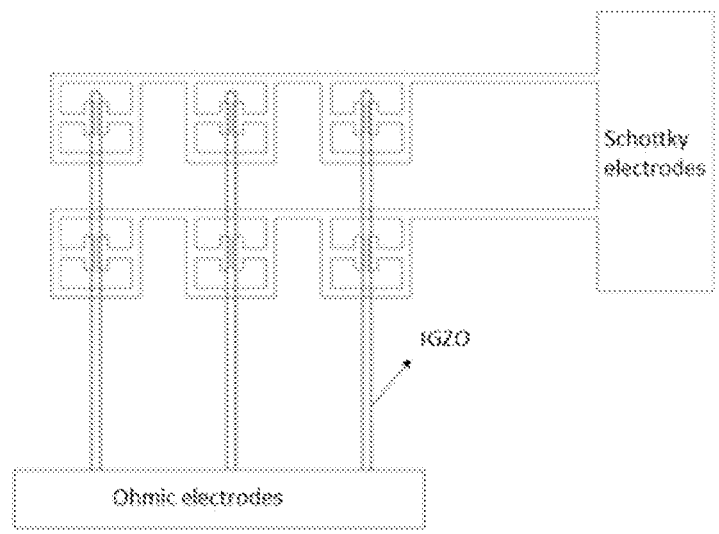
FIG. 4 is the structural schematic diagram of the IGZO Schottky diode with a capacitor-inductor resonant metamaterial array as Schottky electrode.
Figure 5:
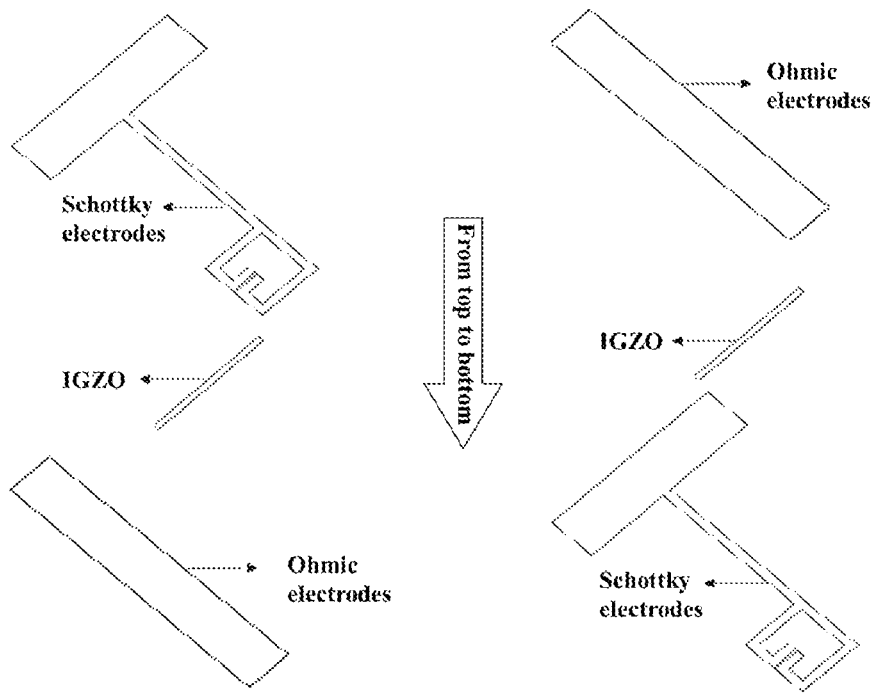
FIG. 5 is the layer-to-layer structure diagram of the IGZO Schottky diodes with a split-ring resonator metamaterial as Schottky electrodes.
Figure 6:
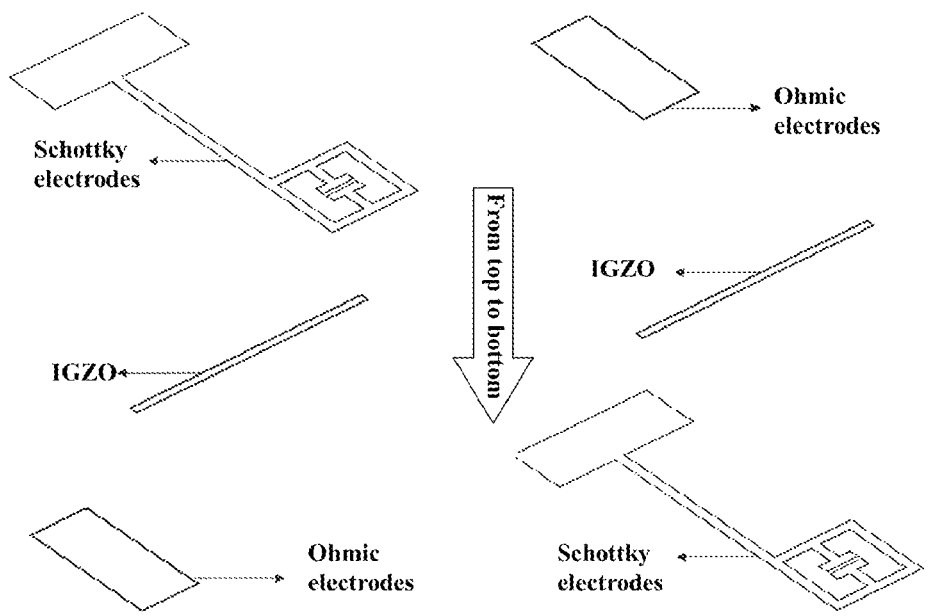
FIG. 6 is the layer-to-layer structure diagram of the IGZO Schottky diodes with a capacitor-inductor resonant metamaterial as Schottky electrodes.

The said metamaterials include split-ring resonator metamaterials, capacitor-inductor resonant metamaterials, split-ring resonator metamaterial arrays, or capacitor-inductor resonant metamaterial arrays. The structure I of the IGZO Schottky diode with a kind of single split-ring resonator metamaterial as Schottky electrode is shown in FIG. 1(a); the structure II of the IGZO Schottky diode with a kind of single split-ring resonator metamaterial as Schottky electrode is shown in FIG. 1(b); the structure I of the IGZO Schottky diode with a kind of capacitor-inductor resonant metamaterial as Schottky electrode is shown in FIG. 2 (a); the structure II of the IGZO Schottky diode with a kind of capacitor-inductor resonant metamaterial as Schottky electrode is shown in FIG. 2 (b); the construction and layer-to-layer structure of the IGZO Schottky diodes with a split-ring metamaterial array as Schottky electrodes are shown in FIG. 3 and FIG. 5 respectively; the construction and layer-to-layer structure of the IGZO Schottky diodes with a capacitor-inductor resonant metamaterial array as Schottky electrodes are shown in FIG. 4 and FIG. 6. Other types of split-ring resonator metamaterials and capacitor-inductor resonant metamaterials may also be combined with IGZO Schottky diodes with reference to FIGS. 1 to 6, to achieve dynamic tuning.

Embodiment 4

Figure 8:
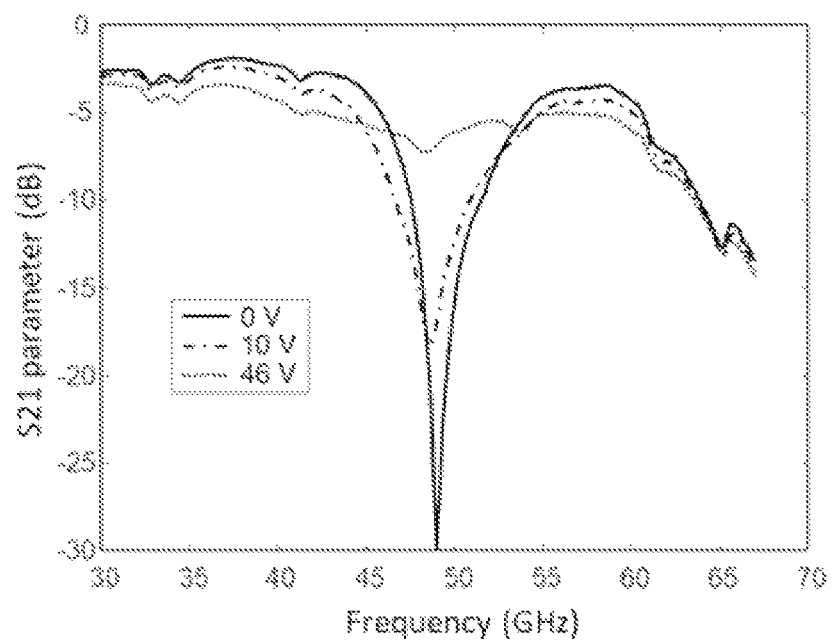
FIG. 8 shows the process of achieving dynamic tuning for the propagation of electromagnetic waves (spoof surface plasmonpolaritons) in the present invention.

The tuning method for active metamaterials using IGZO Schottky diodes according to Embodiment 1, provided however that:

The process of using the resulting IGZO Schottky diodes from step (1) to dynamically tune metamaterials comprises steps as follows:
  A. Positive voltage is applied to the Schottky electrodes, while negative voltage is applied to the ohmic electrodes;
  B. Under the zero-bias state, the IGZO layers covering the gaps of the capacitive structures in the metamaterials is depleted, while strong LC resonance is generated by the capacitive structures in the metamaterials to produce a perfect band-stop response; At 49 GHz, a strong band stop response of up to −31 dB to electromagnetic waves is presented, as shown in FIGS. 6-8.
  C. The positive voltage is increased continuously from zero; with the increase of the positive voltage, the carriers in the IGZO layers move towards the anode, namely from ohmic electrodes to Schottky electrodes; the free carrier concentrations in the IGZO layers at the gaps of the capacitive structures in the metamaterials increase gradually, and so does the conductivity; then, the capacitance at the gaps is suppressed until the capacitive gap is shorted, and the metamaterial structures gradually become quasi-ring structures with weakened attenuation response to electromagnetic signals and higher transmission.

The Schottky electrodes are made of Pd and more than 10 nm thick; the amorphous IGZO active layers are more than 10 nm thick; the ohmic electrodes are made of Ti or Au and more than 10 nm thick.

A preparation method of the IGZO Schottky diodes for dynamic tuning of metamaterials, comprising steps as follows:

Substrate cleaning: The substrates are cleaned with DECON for 5 min, with deionized water for 10 min, and with acetone for 5 min successively; Other cleaning methods may be implemented. after that, they are placed into ethanol immediately to clean for 5 min; finally, they are cleaned with deionized water again and dried by nitrogen gas.

The resulting substrates from step i) are coated with metamaterials through photolithography, electron beam evaporation, and lift-off technologies to obtain Schottky electrodes; Other method for patterning metamaterials may be implemented, such as electroplating and wet etching.

Amorphous IGZO active layers are grown on the resulting Schottky electrodes from step ii): The patterns of the amorphous IGZO active layers are transferred to the resulting samples from step ii) through photolithography; then, the samples are placed into a plasma cleaning machine and cleaned with oxygen plasma for 30 min to remove adhesive residue and form oxygen-enriched environment on the surfaces; Other oxidization methods may be implemented, such as UV Ozone. finally, 750 nm-thick amorphous IGZO layers covering the capacitive gap are fabricated with photolithography, electron beam evaporation, and lift-off technologies. Other thickness for IGZO layers may be implemented. Other deposition method for IGZO layers may be implemented, such as thermal evaporation and sputtering.

Ohmic electrodes (material: Ti/Au; thickness: 10/300 nm) are prepared on the resulting amorphous IGZO active layers from step iii) through photolithography, electron beam evaporation, and lift-off technologies. Other metal materials forming Schottky contact with IGZO may be implemented. Other method for patterning metal structures may be implemented.

FIG. 8 shows the process of achieving dynamic tuning for the propagation of electromagnetic waves (spoof surface plasmonpolaritons) in the present invention;

Limited by the protection voltage limit of the high-frequency testing equipment, the test voltage can only be 46V at the utmost. To obtain an ideal modulation range, AnsysHFSS is used to simulate the modulation effect of IGZO Schottky diodes on metamaterials. As can be seen from the variable values of conductivity extracted from the DC test results of the split resonant ring, the electrical conductivity of the IGZO material increases with the increase of the applied bias voltage; the actual conductivity of the IGZO material varies from $7.9 \times 10^{-6}$ to 0.23 S/m. When the conductivity of the IGZO material is adjusted to 0.016 S/m during the simulation, the ideal modulation range of the transmission can be further improved to 67%, and the ideal modulation range of the absorption can be further improved to 32%. When the applied forward bias voltage reaches 46V, the signal transmission can be modulated from −30 dB to −7 dB, and it can be seen that there is little shift in resonance frequency throughout this modulation.

Figure 9:
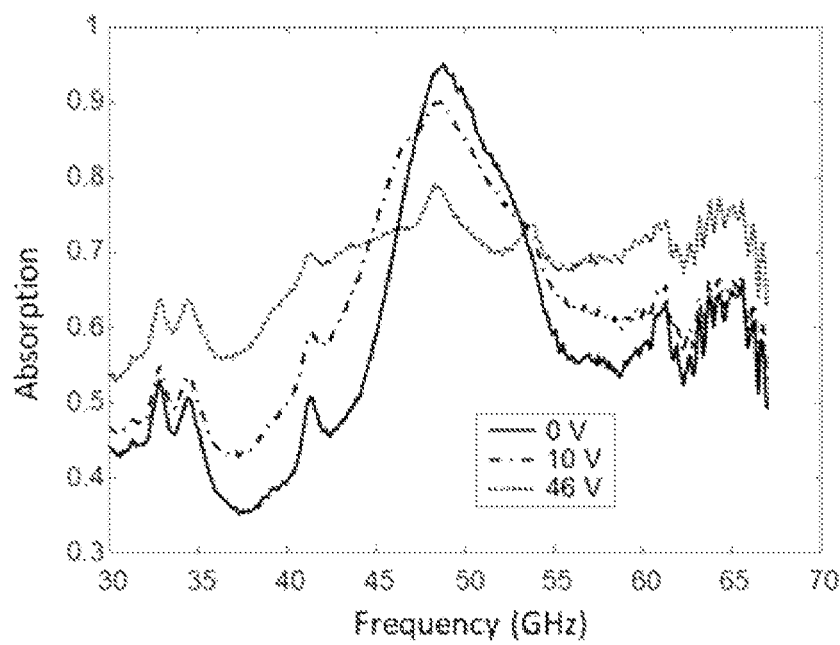
FIG. 9 shows the process of achieving dynamic tuning for the absorption of electromagnetic waves (spoof surface plasmonpolaritons) in the present invention.

FIG. 9 shows the process of achieving dynamic tuning for the absorption of electromagnetic waves (spoof surface plasmonpolaritons) in the present invention. With the increase of bias voltage, when the applied positive voltage is increased to 46V, the absorptivity modulation range of the metamaterial structures reaches 19%, as shown in FIG. 9.

Figure 10:
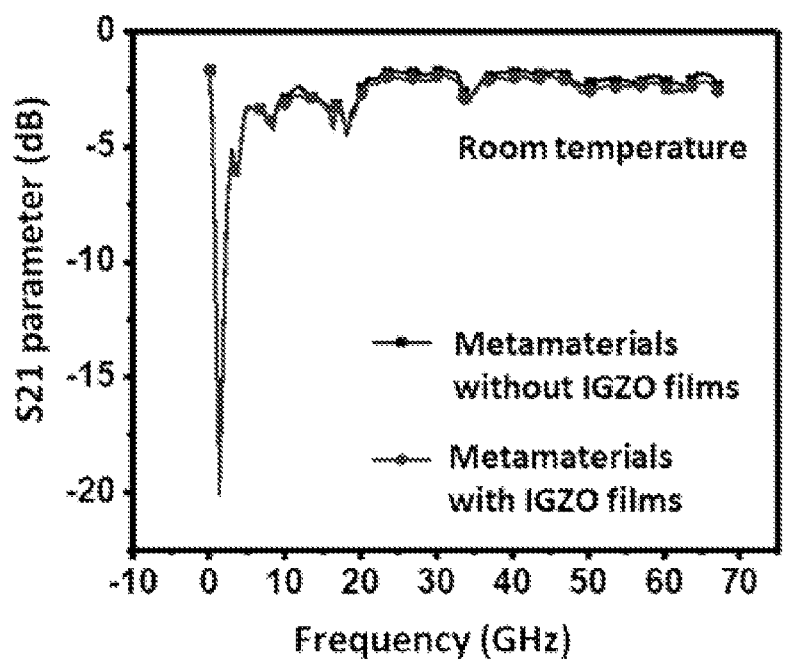
FIG. 10 shows the comparison of the signal transmission of metamaterials covered and not covered by IGZO Schottky diodes in the case of zero voltage.

FIG. 10 shows the comparison of the signal transmission of metamaterials covered and not covered by IGZO Schottky diodes in the case of no voltage. As can be seen from FIG. 10, the IGZO Schottky diodes have little impact on the electromagnetic properties of the metamaterials, namely the insertion loss due to the IGZO is very small when the device is in its initial state, which is a very important advantage of IGZO Schottky diodes in the dynamic tuning of metamaterials.

What is claimed is:

1. A tuning method for active metamaterials using indium-gallium-zinc oxide (IGZO) Schottky diodes, wherein the IGZO Schottky diode comprises substrates, Schottky electrodes, amorphous IGZO active layers, and ohmic electrodes from the bottom up, comprising the following steps:
  (i) metamaterials are used as the Schottky electrodes, and the amorphous IGZO active layers are used to fully cover capacitive structures in the metamaterials; the capacitive structures in the metamaterials are bonded to the amorphous IGZO active layers to form Schottky barriers;
    the substrates are cleaned with DECON, deionized water, and acetone successively; wherein the DECON is a decontamination agent;

then the substrates are placed into ethanol immediately for cleaning;

finally, the substrates are cleaned with deionized water again and dried by nitrogen gas; and (ii) the IGZO Schottky diodes from step (i) are used to tune the metamaterials dynamically.

2. The tuning method for active metamaterials using IGZO Schottky diodes according to claim 1, wherein gaps of the capacitive structures in the metamaterials are less than 5 μm.

3. The tuning method for active metamaterials using IGZO Schottky diodes according to claim 1, wherein the metamaterials comprise Ti as an adhesive layer, Au as a signal transmission layer, and Pd as a Schottky contact metal.

4. The tuning method for active metamaterials using IGZO Schottky diodes according to claim 1, the metamaterials are selected from the group consisting of split-ring resonator metamaterials, capacitor-inductor resonant metamaterials, split-ring resonator metamaterial arrays, and capacitor-inductor resonant metamaterial arrays.

5. The tuning method for active metamaterials using IGZO Schottky diodes according to claim 1, wherein, in the step (ii), the process of using the resulting IGZO Schottky diodes from the step (i) to dynamically tune metamaterials comprises the following steps:
  A. positive voltage is applied to the Schottky electrodes, while negative voltage is applied to the ohmic electrodes;
  B. under a zero-bias state, the IGZO layers covering gaps of the capacitive structures in the metamaterials is depleted, while strong LC resonance is generated by the capacitive structures in the metamaterials to produce a perfect band-stop response; and
  C. the positive voltage is increased continuously from zero; with the increase of the positive voltage, carriers in the IGZO layers move towards anode, from the ohmic electrodes to the Schottky electrodes; free carrier concentrations in the IGZO layers at the gaps of the capacitive structures in the metamaterials increase gradually, and conductivity increases; then, capacitance at the gaps is suppressed until capacitive gap is shorted, and the capacitive structures gradually become quasi-ring structures with weakened attenuation response to electromagnetic signals and higher transmission.

6. The tuning method for active metamaterials using IGZO Schottky diodes according to claim 1, wherein the step (i) further comprises the following steps:
  a. the substrates are coated with the metamaterials through photolithography, metal deposition, and lift-off technologies to obtain the Schottky electrodes;
  b. the amorphous IGZO active layers are grown on the Schottky electrodes from the step a; and
  c. the ohmic electrodes are prepared on the amorphous IGZO active layers from the step b through photolithography, metal deposition, and lift-off technologies; wherein the ohmic electrodes comprise Ti as a contact layer and Au as a protective layer.

7. The tuning method for active metamaterials using IGZO Schottky diodes according to claim 6, wherein, in the step b, the tuning method further comprises the following steps:
  patterns of the amorphous IGZO active layers are transferred to the substrates from step a through photolithography;
  then, the substrates are placed into a plasma cleaning machine and cleaned with oxygen plasma for 30 min to remove adhesive residue and form oxygen-enriched environment on surfaces of the substrates; and
  finally, 750 nm-thick amorphous IGZO layers covering capacitive gap are fabricated with photolithography, metal deposition and lift-off technologies.

8. The tuning method for active metamaterials using IGZO Schottky diodes according to claim 3, wherein a contact metal of the Schottky electrodes with IGZO has larger work function than the work function of IGZO.

9. The tuning method for active metamaterials using IGZO Schottky diodes according to claim 6, wherein a contact metal with IGZO has lower work function than the work function of IGZO.

* * * * *